(12) United States Patent
    Margalit

(10) Patent No.: US 10,271,146 B2
(45) Date of Patent: Apr. 23, 2019

(54) MEMS DUAL COMB DRIVE

(71) Applicant: EMPIRE TECHNOLOGY DEVELOPMENT LLC, Wilmington, DE (US)

(72) Inventor: Mordehai Margalit, Zichron Yaaqov (IL)

(73) Assignee: Empire Technology Development LLC, Wilmington, DE (US)

( * ) Notice: Subject to any disclaimer, the term of this patent is extended or adjusted under 35 U.S.C. 154(b) by 269 days.

(21) Appl. No.: 15/115,273

(22) PCT Filed: Feb. 8, 2014

(86) PCT No.: PCT/US2014/015441
    § 371 (c)(1),
    (2) Date: Jul. 29, 2016

(87) PCT Pub. No.: WO2015/119629
    PCT Pub. Date: Aug. 13, 2015

(65) Prior Publication Data
    US 2017/0006386 A1    Jan. 5, 2017

(51) Int. Cl.
    *B81B 3/00*     (2006.01)
    *H04R 3/04*     (2006.01)
    (Continued)

(52) U.S. Cl.
    CPC ........... *H04R 19/02* (2013.01); *B81B 3/0021* (2013.01); *H04R 3/04* (2013.01); *H04R 19/005* (2013.01);
    (Continued)

(58) Field of Classification Search
    CPC ........ H04R 17/005; H04R 1/24; H04R 1/345; H04R 1/403; H04R 17/00; H04R 19/02;
    (Continued)

(56) References Cited

U.S. PATENT DOCUMENTS 3,939,467 A   2/1976  Cook et al.
5,000,000 A   3/1991  Ingram et al.
        (Continued)

FOREIGN PATENT DOCUMENTS

EP    1737266 A1   12/2006
EP    2271129 A1    1/2011
        (Continued)

OTHER PUBLICATIONS

"Capacitive Micromachined Ultrasonic Transducers (CMUTs)", Retrieved on Apr. 4, 2016 from the Internet at <URL:https://web.archive.org/web/20120126104159/http://www.me.gatech.edu/mist/cmut.htm>, pp. 4.

(Continued)

*Primary Examiner* — Sean H Nguyen

(57) ABSTRACT

Techniques described herein generally include methods and systems related to a speaker device comprises a planar oscillation element configured to generate an ultrasonic acoustic signal, a shutter element, a first comb drive, and a second comb drive. The shutter element is configured to cover an opening that is positioned to receive the ultrasonic acoustic signal to modulate the ultrasonic acoustic signal such that an audio signal is generated. The first comb drive is coupled to the shutter element and configured to displace the shutter element in a first direction and the second comb drive is coupled to the shutter element and configured to displace the shutter element in a second direction.

25 Claims, 11 Drawing Sheets

(51) Int. Cl.
*H04R 19/00* (2006.01)
*H04R 19/02* (2006.01)

(52) U.S. Cl.
CPC *B81B 2203/0136* (2013.01); *H04R 2201/003* (2013.01)

(58) Field of Classification Search
CPC ........ H04R 2201/003; H04R 2201/401; H04R 2217/03; B81B 3/0021; B81B 2203/0136
USPC ........................................................ 381/190
See application file for complete search history.

(56) References Cited

U.S. PATENT DOCUMENTS

| | | | |
|---|---|---|---|
| 5,889,870 | A | 3/1999 | Norris |
| 6,229,899 | B1 | 5/2001 | Norris et al. |
| 6,315,462 | B1 | 11/2001 | Anthamatten et al. |
| 6,388,359 | B1 | 5/2002 | Duelli et al. |
| 6,577,738 | B2 | 6/2003 | Norris et al. |
| 6,584,205 | B1 | 6/2003 | Croft, III et al. |
| 6,606,389 | B1 | 8/2003 | Selfridge et al. |
| 6,612,029 | B2 | 9/2003 | Behin et al. |
| 6,619,813 | B1 | 9/2003 | Schnell |
| 6,631,196 | B1 | 10/2003 | Taenzer et al. |
| 6,678,381 | B1 | 1/2004 | Manabe |
| 6,771,001 | B2 | 8/2004 | Mao et al. |
| 6,778,672 | B2 | 8/2004 | Breed et al. |
| 6,925,187 | B2 | 8/2005 | Norris et al. |
| 7,005,776 | B1 | 2/2006 | Iino et al. |
| 7,327,547 | B1 | 2/2008 | Epstein |
| 7,502,486 | B2 | 3/2009 | Shin et al. |
| 7,747,029 | B2 | 6/2010 | Kim et al. |
| 7,881,489 | B2 | 2/2011 | Matsuzawa et al. |
| 7,945,059 | B2 | 5/2011 | Miyazaki |
| 7,961,900 | B2 | 6/2011 | Zurek et al. |
| 8,079,246 | B2 | 12/2011 | Garmire et al. |
| 8,428,278 | B2 | 4/2013 | Lastrucci |
| 2001/0034938 | A1* | 11/2001 | Behin .................. B81B 3/0021 29/847 |
| 2003/0218793 | A1 | 11/2003 | Soneda et al. |
| 2006/0094988 | A1 | 5/2006 | Tosaya et al. |
| 2006/0291667 | A1 | 12/2006 | Watanabe et al. |
| 2007/0050441 | A1 | 3/2007 | Taenzer et al. |
| 2008/0013761 | A1 | 1/2008 | Matsuzawa et al. |
| 2008/0187154 | A1 | 8/2008 | Martin |
| 2008/0205195 | A1 | 8/2008 | Van Der Merwe |
| 2008/0226096 | A1 | 9/2008 | Waddell et al. |
| 2008/0267431 | A1 | 10/2008 | Leidl et al. |
| 2008/0285777 | A1 | 11/2008 | Pompei |
| 2009/0152980 | A1 | 6/2009 | Huang |
| 2010/0080409 | A1 | 4/2010 | Xu et al. |
| 2010/0098274 | A1 | 4/2010 | Hannemann et al. |
| 2010/0264777 | A1 | 10/2010 | Medhat et al. |
| 2010/0289717 | A1 | 11/2010 | Arslan et al. |
| 2010/0315696 | A1 | 12/2010 | Lee et al. |
| 2011/0115337 | A1 | 5/2011 | Nakamura et al. |
| 2011/0122731 | A1 | 5/2011 | Buccafusca et al. |
| 2011/0123043 | A1 | 5/2011 | Felberer et al. |
| 2011/0182150 | A1 | 7/2011 | Cohen et al. |
| 2012/0014525 | A1 | 1/2012 | Ko et al. |
| 2012/0017693 | A1 | 1/2012 | Robert et al. |
| 2012/0177237 | A1 | 7/2012 | Shukla et al. |
| 2012/0294450 | A1 | 11/2012 | Ozcan |
| 2013/0044904 | A1 | 2/2013 | Margalit |
| 2013/0121500 | A1 | 5/2013 | Lamb et al. |
| 2013/0121509 | A1 | 5/2013 | Hsu et al. |
| 2013/0202119 | A1 | 8/2013 | Thiede |

FOREIGN PATENT DOCUMENTS

| | | | |
|---|---|---|---|
| EP | 2381289 | A1 | 10/2011 |
| JP | S6262700 | A | 3/1987 |
| JP | 2004349815 | A | 12/2004 |
| JP | 2004363967 | A | 12/2004 |
| JP | 2005184365 | A | 7/2005 |
| JP | 2005354582 | A | 12/2005 |
| JP | 2007005872 | A | 1/2007 |
| JP | 2007124449 | A | 5/2007 |
| JP | 2007312019 | A | 11/2007 |
| JP | 2008048312 | A | 2/2008 |
| JP | 2008182583 | A | 8/2008 |
| JP | 2012216898 | A | 11/2012 |
| KR | 1020050054648 | A | 6/2005 |
| WO | 9812589 | A1 | 3/1998 |
| WO | 173934 | A2 | 10/2001 |

OTHER PUBLICATIONS

"Discover the Remarkable Novel Way to Transmit Sound", Retrieved on Mar. 28, 2016 from the Internet at <URL:https://web.archive.org/web/20120911234401/http://www.parametricsound.com/Technology.php>, pp. 4.

"Electrostatic Loudspeaker", Retrieved on Apr. 4, 2016 from the Internet at <URL:https://web.archive.org/web/20130828183848/http://en.wikipedia.org/wiki/Electrostatic_loudspeaker>, last modified on Feb. 27, 2013, pp. 6.

"First Major Innovation in Audio Speakers in Nearly 80 Years!", Audio Pixels Limited, Retrieved on Apr. 4, 2016 from the Internet at <URL:https://web.archive.org/web/20140125163627/http://www.audiopixels.com.au/index.cfm/technology/>, pp. 3.

"Hilbert Transform", Wikipedia, Retrieved on Mar. 28, 2016 from the Internet at <URL:https://web.archive.org/web/20131205110139/http://en.wikipedia.org/wiki/Hilbert_transform>, last modified on Dec. 4, 2013, pp. 17.

"ICsense Designs Asic for World's First Mems Speaker—Audio Pixels Limited and Icsense Enter Strategic Engagement to Support Production of Digital Mems Based Speaker Chip", Retrieved on Nov. 6, 2014 from the Internet at <URL:http://www.icsense.com/NEWS%3A%20Audiopixels>, posted on Oct. 9, 2013, pp. 2.

"Investor Video Presentation", Audio pixel Limited, Retrieved on Nov. 10, 2014 from the Internet at <URL:http://www.audiopixels.com.au/index.cfm/investor/video-presentation/>.

"Microelectromechanical Systems", Wikipedia, Retrieved on Apr. 4, 2016 from the Internet at <URL:https://web.archive.org/web/20131226230521/http://en.wikipedia.org/wiki/Microelectromechanical_systems>, last modified on Nov. 28, 2013, pp. 12.

"Single-sideband Modulation," Retrieved on Mar. 28, 2016 from the Internet at <URL:https://web.archive.org/web/20131217204859/http://en.wikipedia.org/wiki/Single-sideband_modulation>, last modified on Nov. 12, 2013, pp. 9.

"Sound from Ultrasound", Wikipedia, Retrieved on Mar. 28, 2016 from the Internet at <URL: https://web.archive.org/web/20130829134301/http://en.wikipedia.org/wiki/Sound_from_ultrasound>, last modified on Jun. 27, 2013, pp. 10.

Rick Daniell, "Digital Loudspeakers—Part 1", YouTube, Retrieved on Nov. 7, 2014 from the Internet at <URL: https://www.youtube.com/watch?v=VgeUUMvdPel>, Published on Apr. 29, 2012, pp. 2.

Brett M. Diamond, "Digital Sound Reconstruction Using Arrays of CMOS-MEMS Microspeakers", Electrical and Computer Engineering, 2002, pp. 1-60.

Extended European Search Report for European Patent Application No. 11870957.5 (PCT/US2011/04783), dated Apr. 14, 2015.

Extended European Search Report for European Patent Application No. 15200544.3, dated Feb. 19, 2016.

International Search Report and Written Opinion of the International Searching Authority, International application No. PCT/US2011/047833, dated Nov. 28, 2011.

International Search Report and Written Opinion of the International Searching Authority, International application No. PCT/US2014/015438, dated Nov. 7, 2014.

International Search Report and Written Opinion of the International Searching Authority, International application No. PCT/US2014/015439, dated Oct. 29, 2015.

International Search Report and Written Opinion of the International Searching Authority, International application No. PCT/US2014/015440, dated Oct. 27, 2015.

(56) References Cited

OTHER PUBLICATIONS

International Search Report and Written Opinion of the International Searching Authority, International application No. PCT/US2014/015441, dated Oct. 29, 2015.
Eino Jakku et al., "The Theory of Electrostatic Forces in a Thin Electret (MEMS) Speaker", Proceedings IMAPS Nordic 2008 Helsingor, Sep. 14-16, 2008, pp. 95-100.
Brian D. Jensen et al., "Shaped Comb Fingers for Tailored Electromechanical Restoring Force", Journal of Microelectromechanical Systems, Jun. 25, 2003, pp. 373-383, vol. 12, No. 3.
Anatol Khilo et al., "Broadband Linearized Silicon Modulator", Optics Express, Feb. 23, 2011, pp. 4485-4500, vol. 19, No. 5.
Rob Legtenberg et al., "Comb-Drive Actuators for Large Displacements", Journal of Micromechanics and Microengineering, 1996, pp. 320-329, vol. 6.
Isaac Leung, "Sony to Help Develop Next-generation MEMS-based Speakers", Retrieved on Apr. 4, 2016 from the Internet at <URL: https://web.archive.org/web/20120327134931/http://www.electronicsnews.com.au/features/sony-to-help-develop-next-generation-mems-based-sp>, posted on Jul. 8, 2011, pp. 2.
Nguyen, C., "MEMS Comb-Drive Actuators", Microfabrication Technology, 2010, pp. 3.
M. Olfatnia et al., "Note: An Asymmetric Flexure Mechanism for Comb-Drive Actuators", Review of Scientific Instruments, 2012, pp. 116105-1-116105-3, vol. 83, Issue 11.
Mohammad Olfatnia et al., "Large Stroke Electrostatic Comb-Drive Actuators Enabled by a Novel Flexure Mechanism", Journal of Microelectromechanical Systems, Apr. 2013, pp. 483-494, vol. 22, No. 2.
Alexander A Trusov et al., "Capacitive Detection in Resonant MEMS with Arbitrary Amplitude of Motion", Journal of Micromechanics and Microengineering, Aug. 2007, pp. 1583-1592, vol. 17.
Tristan T. Trutna et al., "An Enhanced Stability Model for Electrostatic Comb-Drive Actuator Design", Proceedings of the ASME 2010 International Design Engineering Technical Conferences & Computers and Information in Engineering Conference IDETC/CIE, Aug. 15-18, 2010.
Wenjing Ye et al., "Optimal Shape Design of an Electrostatic Comb Drive in Microelectromechanical Systems", Journal of Microelectromechanical Systems, Mar. 1998, pp. 16-26, vol. 7, No. 1.
Masahide Yoneyama et al., "The Audio Spotlight: An Application of Nonlinear Interaction of Sound Waves to a New Type of Loudspeaker Design", Journal of the Acoustical Society of America, May 1983, pp. 1532-1536, vol. 73, No. 5.
Feiertag, G., et al.,"Determining the acoustic resistance of small sound holes for MEMS microphones." Procedia Engineering, vol. 25, pp. 1509-1512 (2011).

\* cited by examiner

MEMS DUAL COMB DRIVE

CROSS-REFERENCE TO RELATED APPLICATION

The present application is a U.S. national stage filing under 35 U.S.C. § 371 of International Application PCT/US2014/015441, filed Feb. 8, 2014 and entitled "MEMS DUAL COMB DRIVE." The International Application, including any appendices or attachments thereof, is hereby incorporated by reference in its entirety.

BACKGROUND

Unless otherwise indicated herein, the approaches described in this section are not prior art to the claims in this application and are not admitted to be prior art by inclusion in this section.

Microelectromechanical systems, or MEMS, is a technology that includes miniaturized mechanical and electro-mechanical elements, devices, and structures that may be produced using batch micro-fabrication or micro-machining techniques associated with the integrated circuit industry. The various physical dimensions of MEMS devices can vary greatly, for example from well below one micron to as large as the millimeter scale. In addition, there may be a wide range of different types of MEMS devices, from relatively simple structures having no moving elements, to extremely complex electromechanical systems with multiple moving elements under the control of integrated microelectronics. Such devices may include microsensors, microactuators, and microelectronics. Microsensors and microactuators may be categorized as "transducers," which are devices that may convert energy from one form to another. In the case of microactuators, a MEMS device may typically convert an electrical signal into some form of mechanical actuation.

SUMMARY

In accordance with at least some embodiments of the present disclosure, a speaker device comprises a planar oscillation element configured to generate an ultrasonic acoustic signal, a shutter element, an electrostatically actuated first comb drive, and an electrostatically actuated second comb drive. The shutter element is configured to cover an opening that is positioned to receive the ultrasonic acoustic signal to modulate the ultrasonic acoustic signal such that an audio signal is generated. The electrostatically actuated first comb drive is coupled to the shutter element and configured to displace the shutter element in a first direction in response to a first electrical bias applied between a static comb of the first comb drive and a movable comb of the first comb drive. The electrostatically actuated second comb drive is coupled to the shutter element and configured to displace the shutter element in a second direction that is opposite to the first direction in response to a second electrical bias applied between a static comb of the second comb drive and a movable comb of the second comb drive.

In accordance with at least some embodiments of the present disclosure, a microelectromechanical (MEMS) actuator comprises a body element, an electrostatically actuated first comb drive, and an electrostatically actuated second comb drive. The electrostatically actuated first comb is drive coupled to the body element and configured to displace the body element in a first direction in response to a first electrical bias applied between a static comb of the first comb drive and a movable comb of the first comb drive. The electrostatically actuated second comb drive is coupled to the body element and configured to displace the body element in a second direction that is opposite to the first direction in response to a second electrical bias applied between a static comb of the second comb drive and a movable comb of the second comb drive.

In accordance with at least some embodiments of the present disclosure, a method to operate a MEMS speaker device comprises generating an ultrasonic acoustic signal with a planar oscillation element and modulating the ultrasonic acoustic signal to generate an audio signal by operating a shutter element to cover an opening that is positioned to receive the ultrasonic acoustic signal. Operating the shutter element includes electrostatically actuating a first comb drive to displace the shutter element in a first direction in response to a first electrical bias applied between a static comb of the first comb drive and a movable comb of the first comb drive and electrostatically actuating a second comb drive to displace the shutter element in a second direction that is opposite to the first direction in response to a second electrical bias applied between a static comb of the second comb drive and a movable comb of the second comb drive.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
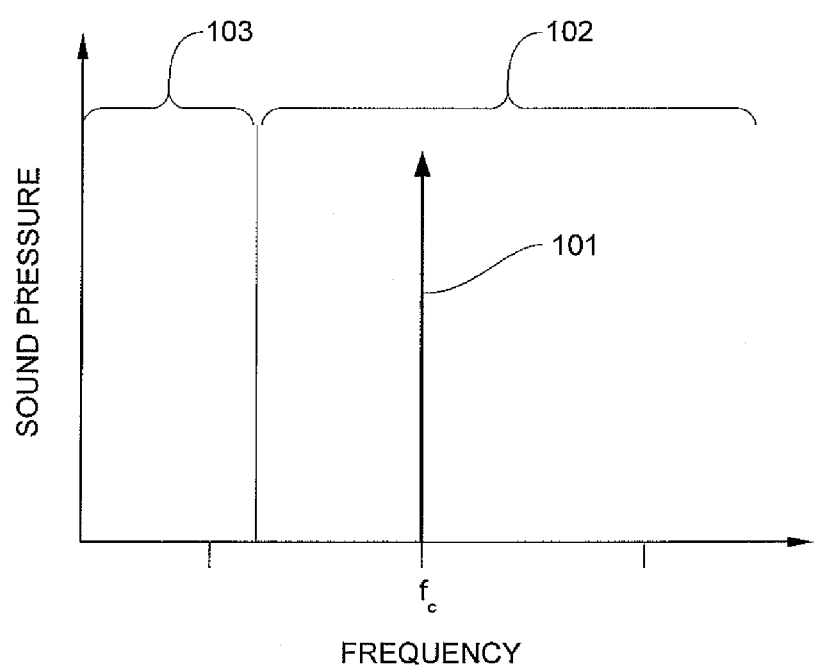
FIG. 1 schematically illustrates an example ultrasonic signal generated by a microelectromechanical system (MEMS) based audio speaker system.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. The aspects of the disclosure, as generally described herein, and illustrated in the Figures, can be arranged, substituted, combined, and designed in a wide variety of different configurations, all of which are explicitly contemplated and made part of this disclosure.

Loudspeaker design has changed little in nearly a century. A loudspeaker (or "speaker") is an electroacoustic transducer that produces sound in response to an electrical signal input. The electrical signal causes a vibration of the speaker cone in relation to the electrical signal amplitude. The resulting pressure change is the sound heard by the ear. In traditional speakers, the sound level is related to the square of the frequency. Consequently, speakers for producing low-frequency sounds may be larger and more powerful than speakers for producing higher-frequency sounds. It is for this reason that small tweeters may be commonly used for high-frequency audio signals and large subwoofers may be used for generating low-frequency audio signals. According to embodiments of the disclosure, a microelectromechanical systems (MEMS) structure may be configured as a speaker for generating audio signals.

MEMS technology is used for a wide variety of miniaturized mechanical and electro-mechanical devices. However, the small size of MEMS devices has mostly precluded the use of MEMS technology for audio speaker applications, since the frequency of sound emitted by a micron-scale oscillating membrane is generally in the ultrasonic regime. Some MEMS acoustic modulators may be used to create audio signals from a high frequency acoustic source, such as a MEMS-based audio speaker system. Specifically, an audible audio signal may be created by generating an ultrasonic signal with a MEMS oscillation membrane or a piezoelectric transducer, and then modulating the ultrasonic signal with an acoustic modulator, such as a MEMS shutter element. Because the ultrasonic signal may act as an acoustic carrier wave and the acoustic modulator may superimpose an input signal thereon by modulating the ultrasonic signal, the resultant signal generated by the MEMS-based audio speaker system may be a function of the frequency difference between the ultrasonic signal and the input signal. In this way, acoustic signals can be generated by a MEMS-based audio speaker system in the audible range and as low as the sub-100 Hz range, despite the very small size of such a speaker system.

FIG. 1 schematically illustrates an example ultrasonic signal 101 generated by the above-described MEMS-based audio speaker system. As shown, ultrasonic signal 101 may be located at the carrier frequency $f_c$ in the ultrasound region 102 of the sound frequency spectrum, and not in the audible region 103 of the sound frequency spectrum. The audible region 103 may generally include the range of human hearing, extending from about 20 Hz to about 20 kHz, and the ultrasound region 102 may include some or all frequencies higher than about 20 kHz.

Figure 2:
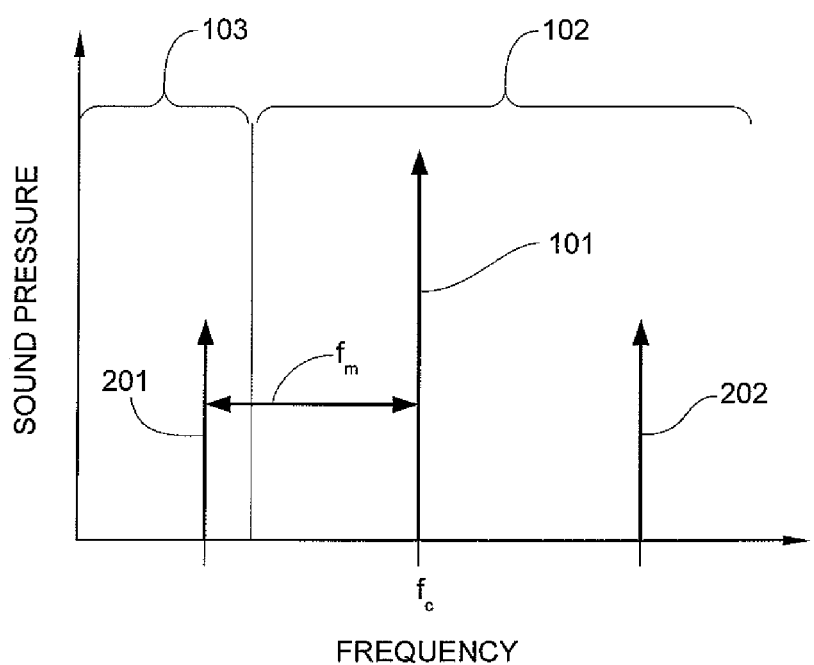
FIG. 2 schematically illustrates examples of a low frequency modulated sideband and a high frequency modulated sideband, which may be generated when the ultrasonic signal of FIG. 1 is amplitude modulated with an acoustic modulator in the MEMS-based audio speaker system.

FIG. 2 schematically illustrates examples of a low frequency modulated sideband 201 and high frequency modulated sideband 202, which may be generated when ultrasonic signal 101 is amplitude modulated with an acoustic modulator in the above-described MEMS-based audio speaker system. Low frequency modulated sideband 201 and high frequency modulated sideband 202 may be harmonic signals that are each functions of the modulation frequency $f_m$, where the modulation frequency $f_m$ may be, for example, the frequency of modulation of the MEMS shutter element or other acoustic modulator of the MEMS-based audio speaker system. Specifically, low frequency modulated sideband 201 and high frequency modulated sideband 202 may each be functions of the frequency difference between the carrier frequency $f_c$ and the modulation frequency $f_m$. High frequency modulated sideband 202 may be located in ultrasound region 102 and therefore may not be audible. In contrast, low frequency modulated sideband 201 may be located in audible region 103, and may represent an audible output signal from the MEMS-based audio speaker system. Thus, an audible signal can be generated by a MEMS-based audio speaker system.

Briefly stated, a MEMS-based audio speaker system according to embodiments of the present disclosure, may include one or more planar oscillation elements configured to generate an ultrasonic acoustic signal and one or more movable sound-obstruction elements, referred to herein as shutter elements. Each of the one or more shutter elements may include a portion configured to obscure an opening that is positioned to receive the ultrasonic acoustic signal generated by the one or more planar oscillation elements. By alternately obscuring and revealing the opening at modulation frequency $f_m$, the ultrasonic acoustic signal can be modulated so that an audio signal is generated, such as low frequency modulated sideband 201 in FIG. 2. Stated another way, a shutter element can be used to implement a modulation function on an acoustic carrier signal (that is for example at carrier frequency $f_c$) to generate an audio signal. Thus, given an appropriate modulation function and a suitably configured shutter element, a target acoustic output signal for the MEMS-based audio speaker system can be generated.

In the above-described MEMS-based audio speaker system, a MEMS comb drive may be employed in some embodiments to actuate the shutter element and implement the modulation function on an acoustic carrier signal. To implement such a modulation function, the shutter element may be actuated at relatively high frequencies (e.g., as high as 50 to 100 kHz) and for relatively large displacements (e.g., 10 to 20 microns or more). However, in a conventional MEMS comb drive design, there may generally be a trade-off between actuation distance and speed. This is because the voltage-driven force (and therefore motion) generated in a comb drive may typically operate against a spring, and the force generated by the spring may be related to the distance the spring is displaced from the neutral position of the spring. Thus, a conventional MEMS comb drive may be considered a spring-mass system with a particular resonant frequency. Generally, in a spring-mass system, motion of the system may be strongly attenuated whenever oscillation is at a frequency greater than this resonant frequency. To realize large movements in such a system, a weaker spring may generally be employed, whereas to realize high frequency oscillation, a stronger spring may generally be employed. Consequently, configuring a MEMS comb drive that can operate at a suitably high frequency while also providing a range of movement large enough to modulate an acoustic carrier signal may be problematic. For example, given a target actuation of 20 to 30 microns, a conventional MEMS comb drive may have a resonant frequency on the order of about 1 kHz, while movement of the comb drive at a frequency of 50 to 100 kHz may be required to modulate an acoustic carrier signal effectively.

In light of the issues described above with some MEMS-based audio speaker systems, this disclosure is generally drawn, inter alia, to methods, apparatus, systems, and devices related to MEMS devices that address at least some of these issues.

According to embodiments of the disclosure, a MEMS-based audio speaker system may include a MEMS dual comb drive, which may be a MEMS actuator configured with a first comb drive an second comb drive. The first comb drive is coupled to a body element (such as a shutter element for modulation of an acoustic carrier signal) and is configured to displace the body element in a first direction. The second comb drive is also coupled to the body element, but is configured to displace the body element in a second direction that is opposite to the first direction. In this way, the MEMS actuator operates differently than a conventional MEMS comb drive, since a spring is not employed to move the body element in one of the two directions of motion of the body element. Instead, the second comb drive is employed for this purpose. Because the first and second comb drives do not displace the body element in opposition to a strong spring force, displacement of the body element is not dictated by the linear displacement dependence of a spring force. Consequently, embodiments of the MEMS dual comb drive actuator described herein may provide a large stroke, high speed actuation of the body element. Details of the configuration and operation of such a MEMS dual comb actuator are set forth below in conjunction with FIGS. 3-5. An embodiment of a MEMS-based audio speaker system that may include such a MEMS dual comb actuator is described in FIGS. 3 and 4.

Figure 3:
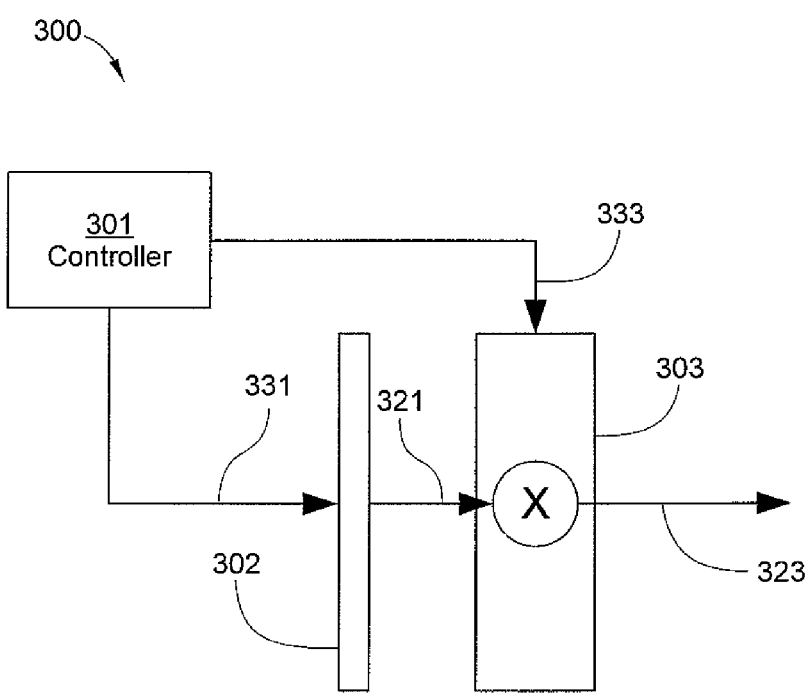
FIG. 3 is a block diagram illustrating a MEMS-based audio speaker system, arranged in accordance with at least some embodiments of the present disclosure.

FIG. 3 is a block diagram illustrating a MEMS-based audio speaker system, also referred to as a pico speaker system 300, arranged in accordance with at least some embodiments of the present disclosure. Pico speaker system 300 may be a compact, energy-efficient acoustic generator capable of producing acoustic signals throughout the audible portion of the sound frequency spectrum, for example from the sub-100 Hz range to 20 kHz and above. As such, pico speaker system 300 may be well-suited for mobile devices and/or any other applications in which size, sound fidelity, or energy efficiency may be beneficial.

Pico speaker system 300 may include a controller 301, an oscillation membrane 302, and a MEMS modulator 303, for example arranged as shown in FIG. 3. In some embodiments, oscillation membrane 302, and MEMS modulator 303 may be configured as part of a single MEMS structure, where oscillation membrane 302 may be formed from a layer or thin film on a substrate, and MEMS modulator 303 may be formed from a different layer or thin film on the substrate. In other embodiments, MEMS modulator 303 may be formed from a layer or thin film on a MEMS substrate, and oscillation membrane 302 may be a separately fabricated device that is coupled to the MEMS substrate, such as a piezoelectric transducer. Other configurations of MEMS shutters and oscillation membranes arranged in a pico speaker system may also fall within the scope of the present disclosure.

Controller 301 may be configured to control the various active elements of pico speaker system 300 so that a resultant acoustic signal 323 is produced by pica speaker system 300 that is substantially similar to a target audio output. For example, controller 301 may be configured to generate and supply oscillation signal 331 to oscillation membrane 302 so that oscillation membrane 302 generates an ultrasonic acoustic carrier signal 321. Controller 301 may also be configured to generate and supply a modulation signal 333 to MEMS modulator 303. Oscillation signal 333 is described in greater detail below. Controller 301 may include logic circuitry incorporated in pico speaker system 300 and/or a logic chip or other circuitry that is located remotely from pica speaker system 300. Alternatively or additionally, some or all functions or operations of controller 301 may be performed by a software construct or module that is loaded into such circuitry or is executed by one or more processor devices associated with pico speaker system 300. In some embodiments, the logic circuitry of controller 301 may be formed on the MEMS substrate from which MEMS modulator 303 is formed.

Oscillation membrane 302 may be any technically feasible device configured to generate ultrasonic acoustic carrier signal 321, where ultrasonic acoustic carrier signal 321 may be an ultrasonic acoustic signal of a fixed frequency. In some embodiments, ultrasonic acoustic carrier signal 321 may have a fixed frequency of at least about 50 kHz, for example. In some embodiments, ultrasonic acoustic carrier signal 321 may have a fixed frequency that is significantly higher than 50 kHz, for example 100 kHz or more. Furthermore, in some embodiments, oscillation membrane 302 may have a very small form factor, for example on the order of 10s or 100s of microns. Consequently, in some embodiments, oscillation membrane 302 may be a MEMS oscillation membrane or other planar oscillation element formed from a layer or thin film disposed on a MEMS substrate and micro-machined accordingly. Thus, oscillation membrane 302 may be substantially stationary with respect to adjacent elements of pica speaker system 300, e.g., having one, some, or all edges anchored to adjacent elements of pico speaker system 300, for example with MEMS spring structures.

In such embodiments, a target oscillation may be induced in oscillation membrane 302 via any suitable electrostatic MEMS actuation scheme, in which a time-varying voltage signal (e.g., oscillation signal 331) is applied to oscillation membrane 302. Alternatively, oscillation membrane 302 may be a piezoelectric transducer configured to generate ultrasonic acoustic carrier signal 321. In either case, oscillation membrane 302 may be oriented so that ultrasonic acoustic carrier signal 321 can be directed toward MEMS modulator 303, as shown in FIG. 3. In the embodiment illustrated in FIG. 3, ultrasonic acoustic carrier signal 321 may be generated in a direction substantially orthogonal to a primary surface 302A (see FIG. 5) of oscillation membrane 302.

MEMS modulator 303 may include a micro-machined body element and first and second MEMS comb drives. The micro-machined body element may be, for example, a sound-blockage shutter element that is configured to modulate ultrasonic acoustic carrier signal 321 according to modulation signal 333, and thereby generate audio signal 323. The first MEMS comb drive may be configured to displace the body element of MEMS modulator 303 in a first direction and the second MEMS comb drive may be configured to displace the body element in a second direction that is opposite to the first direction. By alternately positioning the body element so that an acoustic carrier wave is blocked and unblocked, the acoustic carrier wave can be modulated according to a particular modulation signal.

Thus, as indicated in FIG. 3, MEMS modulator 303 multiplies ultrasonic acoustic carrier signal 321, which may be a sinusoidal function, by modulation signal 333, which may also be a sinusoidal function. The result of such a multiplication may be a sum of frequencies and a difference of frequencies, where the sum of frequencies may correspond to a signal having a frequency greater than the modulation signal (for example high frequency modulated sideband 202 in FIG. 2) and the difference of frequencies may correspond to the audible audio signal (for example low frequency modulated sideband 201 in FIG. 2). Thus, when modulation signal 333 is based on a suitable modulation function, audio signal 323 may be produced that is substantially similar to a target audio output for pico speaker system 300.

The modulation function, referred to herein as A(t), used to generate modulation signal 333, may be based on a target audio signal to be generated by pico speaker system 300. For example, in some embodiments, modulation function A(t) may include a time-varying acoustic signal that substantially corresponds to the target audio output of the pico speaker system 300. In some embodiments, modulation function A(t) may also include additional elements that enhance fidelity of audio signal 323 with respect to the target audio output. For example, modulation function A(t) may include one or more predistortion elements configured to compensate for frequency-dependent behavior associated with the pico speaker system. Alternatively or additionally, modulation function A(t) may include one or more elements to augment one or more bands of the output of pico speaker system 300, such as bass or treble. In some embodiments, modulation function A(t) may be provided to controller 301 during operation and controller 301 may then generate a suitable modulation signal 333. Alternatively, a target acoustic output for pico speaker system 300 may be provided to controller 301, and controller 301 may determine both modulation function A(t) and modulation signal 333.

In some embodiments, modulation signal 333 may be a time-varying voltage signal configured to cause a shutter element of MEMS modulator 303 to be displaced in a manner described by first modulation function A(t). Unlike a conventional MEMS comb drive, very little or no spring force is exerted on the shutter element of MEMS modulator 303 in such embodiments. Thus, motion (for example, acceleration) of the shutter element may be described simply by Newton's second law (where $a=F/m$), and does not include a significant spring force term. In contrast, for a conventional MEMS comb drive, acceleration of the comb drive may be a function of a spring force term that includes the spring constant (k) and the displacement (x) of the comb drive: $a=F/m-kx/m$. Consequently, motion of MEMS modulator 303 may be related to the actuating force, which may be directly controlled by voltage applied to the first and second comb drives of MEMS modulator 303. An embodiment of MEMS modulator 303 configured with the above-described first and second comb drives is illustrated in FIG. 4.

Figure 4:
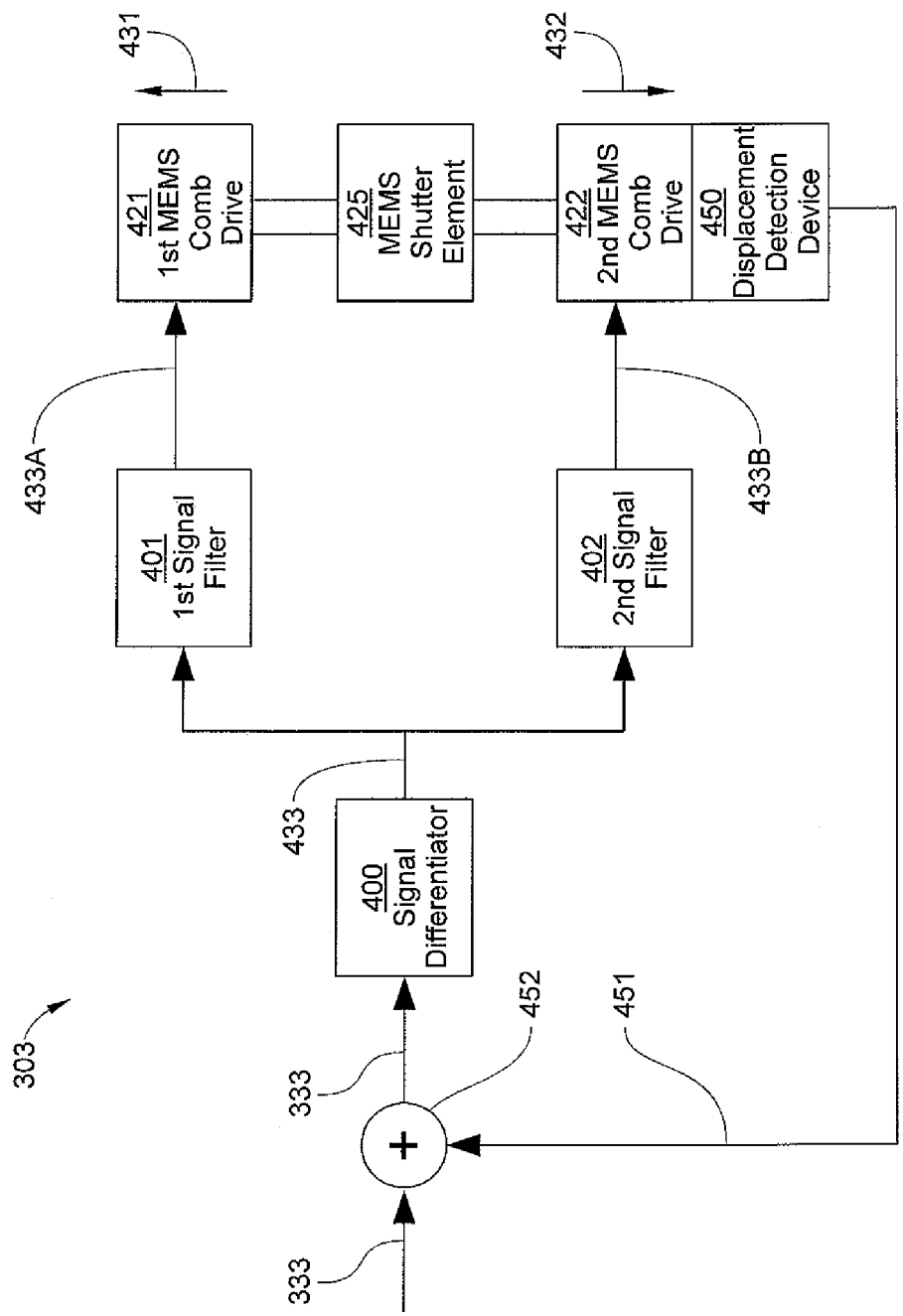
FIG. 4 is a block diagram illustrating an embodiment of a MEMS modulator in FIG. 3.

FIG. 4 is a block diagram illustrating an embodiment of MEMS modulator 303 of FIG. 3. As shown, MEMS modulator 303 may include a signal differentiator 400, a first signal filter 401, a second signal filter 402, a first MEMS comb drive 421, a second MEMS comb drive 422, and a displaceable body element (referred to herein as MEMS shutter element 425), which may all be operatively coupled to each other. Embodiments of first MEMS comb drive 421, second MEMS comb drive 422, and MEMS shutter element 425 are described below in conjunction with FIG. 5.

Signal differentiator 400 may be configured to receive modulation signal 333 and generate a voltage drive signal 433 for driving first MEMS comb drive 421 and second MEMS comb drive 422. Because modulation signal 333 may define a particular motion (e.g., time-varying displacement) of MEMS shutter element 425 to generate audio signal 323 in FIG. 3, and because displacement of MEMS shutter element 425 may be described simply by Newton's second law (where $a=F/m$) and without a significant spring force term, signal differentiator 400 may determine voltage drive signal 433 by taking the second derivative of modulation signal 333. Thus, signal differentiator 400 may be configured to determine an acceleration of MEMS shutter element 425, where the acceleration may be based on a target audio signal. Because first MEMS comb drive 421 and second MEMS comb drive 422 may be configured to exert an actuation force on MEMS shutter element 425 in opposite directions, voltage drive signal 433 may be separated into two components by first signal filter 401 and second signal filter 402.

First signal filter 401 may be configured to filter any negative portion of voltage drive signal 433 to produce positive voltage drive signal 433A, which is directed to first MEMS comb drive 421. Similarly, second signal filter 402 may be configured to filter any positive portion of voltage drive signal 433 to produce negative voltage drive signal 433B, which is directed to second MEMS comb drive 422. In this way, first MEMS comb drive 421 actuates MEMS shutter element 425 in a first direction, for example direction 431, by exerting an actuation force in the first direction, and second MEMS comb drive 422 actuates MEMS shutter element 425 in a second direction, for example direction 432, by exerting an actuation force in the second direction. Furthermore, because positive voltage drive signal 433A and negative voltage drive signal 433B are each separated from voltage drive signal 433, first MEMS comb drive 421 may be inactive when second comb drive 422 exerts the actuation force to displace MEMS shutter element 425 in direction 432, and second comb drive 422 may be inactive when first comb drive 421 exerts the actuation force to displace MEMS shutter element 425 in direction 432 opposite to direction 431.

In some embodiments, second comb drive 422 may include a displacement detection device 450 configured to compare an actual displacement of MEMS shutter element 425 with a target displacement of shutter element 425 and to generate a feedback signal 451 that may be added to modulation signal 333 via a signal summer 452. In this way, displacement detection device 450 can reduce sensitivity of MEMS modulator 303 to long-term variation in accuracy caused by drift and/or short-term variation in accuracy caused by accelerations or drops. In some embodiments, displacement detection device 450 may include a capacitance-measurement circuit or other capacitance-measurement element that measures or otherwise determines, for example, current versus voltage during operation of MEMS modulator 303. Capacitance of second comb drive 422 may be proportional to displacement of shutter element 425 and second comb drive 422. Consequently, feedback signal 451 can be configured to indicate the difference of the actual displacement of shutter element 425 and second comb drive 422 with the target displacement of shutter element 425 and second comb drive 422.

In the embodiment illustrated in FIG. 4, signal differentiator 400, first signal filter 401, second signal filter 402, and displacement detection device 450 are depicted as constituent parts of MEMS modulator 303. In other embodiments, one or more of signal differentiator 400, first signal filter 401, second signal filter 402, and displacement detection device 450 may be included as part of logic circuitry of controller 301 or otherwise formed on the MEMS substrate from which MEMS modulator 303 is formed.

Figure 5:
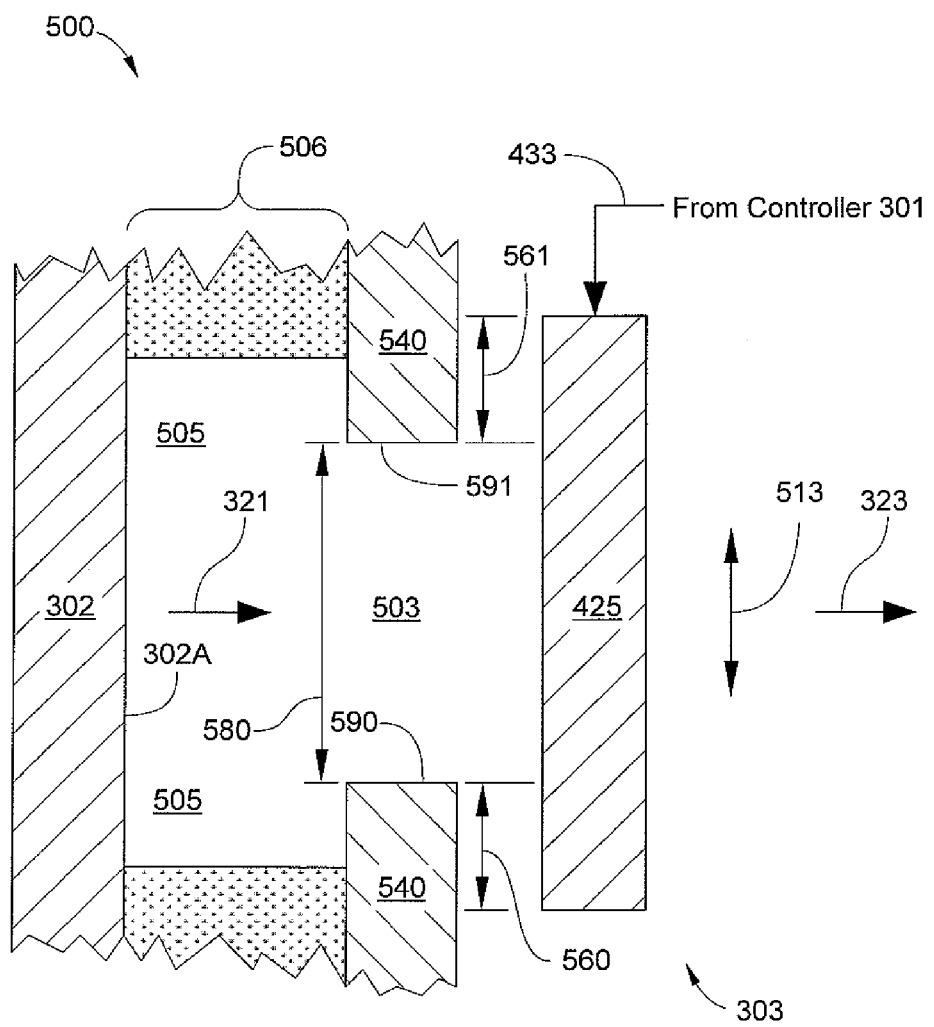
FIG. 5 is a cross-sectional view of an example embodiment of a pico speaker system in which the MEMS modulator of FIG. 4 may be configured to perform amplitude modulation of an ultrasonic carrier signal in accordance with at least some embodiments of the present disclosure.

FIG. 5 is a cross-sectional view of an example embodiment of a pico speaker system 500 in which MEMS modulator 303 may be configured to perform amplitude modulation of ultrasonic carrier signal 321 in accordance with at least some embodiments of the present disclosure. In the embodiment illustrated in FIG. 5, pico speaker system 500 may be realized as a MEMS structure formed from various layers and/or thin films formed on a MEMS substrate. Pico speaker system 500 may include oscillation membrane 302, an acoustic pipe 505, an aperture 503, and MEMS modulator 303. For clarity, first comb drive 421 and second comb drive 422 of MEMS modulator 303 are omitted and only MEMS shutter element 425 (body element) of MEMS modulator 303 is shown.

As noted previously, oscillation membrane 302 may be formed from a layer or thin film on a substrate, and MEMS modulator 303 may be formed from a different layer or thin film on the substrate. Acoustic pipe 505 may be formed by the removal of a portion of a sacrificial layer 506 that is formed on the MEMS substrate. Aperture 503 may have a width 580 on the order of 10s or 100s of microns and, in some embodiments, may be formed in a blind element 540 that is disposed between oscillation membrane 302 on one side and MEMS modulator 303 on the other side. In such embodiments, blind element 540 may be formed from a layer or thin film disposed on the MEMS substrate on which oscillation membrane 302 and MEMS shutter element 425 are formed. Furthermore, in some embodiments, aperture 503 may be configured as a plurality of openings formed in blind element 540 that can be obscured by MEMS shutter element 425 rather than as a single opening in blind element 540 as shown in FIG. 5.

In some embodiments, MEMS shutter element 425 may be configured to translate in a direction substantially orthogonal to the direction in which ultrasonic carrier signal 321 propagates. For example, in FIG. 5, with ultrasonic carrier signal 321 propagating from left to right along an x-axis, MEMS shutter element 425 may translate up or down along a y-axis. In such embodiments, MEMS shutter element 425 may be positioned substantially parallel to primary surface 302A of oscillation membrane 302. In addition, in such embodiments, first MEMS comb drive 421 and second MEMS comb drive 422 (not shown) may be used to convert a voltage signal 433 from controller 301 into a displacement 513 of MEMS modulator 303. Any suitable configuration of a MEMS dual comb drive, as described in conjunction with FIG. 4, may be used for actuating MEMS shutter element 425 in FIG. 5, provided the MEMS dual comb drive 1) can provide sufficient magnitude of displacement 513 to obscure and reveal aperture 503, and 2) has an operational bandwidth that includes the frequency of ultrasonic carrier signal 321.

Generally, any configuration of MEMS shutter element 425 may be used that can obscure at least a sufficient portion of aperture 503 to modulate ultrasonic carrier signal 321. Furthermore, the dimensions of MEMS shutter element 425 and magnitude of displacement 513 may be selected such that aperture 503 can be completely obscured by MEMS shutter element 425 and edges 590 and 591 can be overlapped respectively by overlap distances 560 and 561. Alternatively, MEMS shutter may be configured to overlap only some of the edges of aperture 503, for example only one of edges 590 or 591, or to overlap none of the edges of aperture 503.

As shown, in some embodiments, ultrasonic carrier signal 321 may be generated by oscillation membrane 302 and propagate into acoustic pipe 505. Ultrasonic carrier signal 321 may pass from acoustic pipe 505 through aperture 503, which is alternately obscured and revealed by MEMS shutter element 425, where the motion of MEMS shutter element 425 along displacement 513 may be defined by modulation signal 333. Modulation signal 333 (shown in FIG. 3) may be implemented as displacement 513 of MEMS shutter via application of positive voltage drive signal 433A (shown in FIG. 4) to first MEMS comb drive 421 and application of negative voltage drive signal 433B (shown in FIG. 4) to second MEMS comb drive 422 by controller 301. Movement of MEMS shutter element 425 in this manner in response to positive voltage drive signal 433A and negative voltage drive signal 433B modulates ultrasonic carrier signal 321 to generate audio signal 323.

Figure 6:
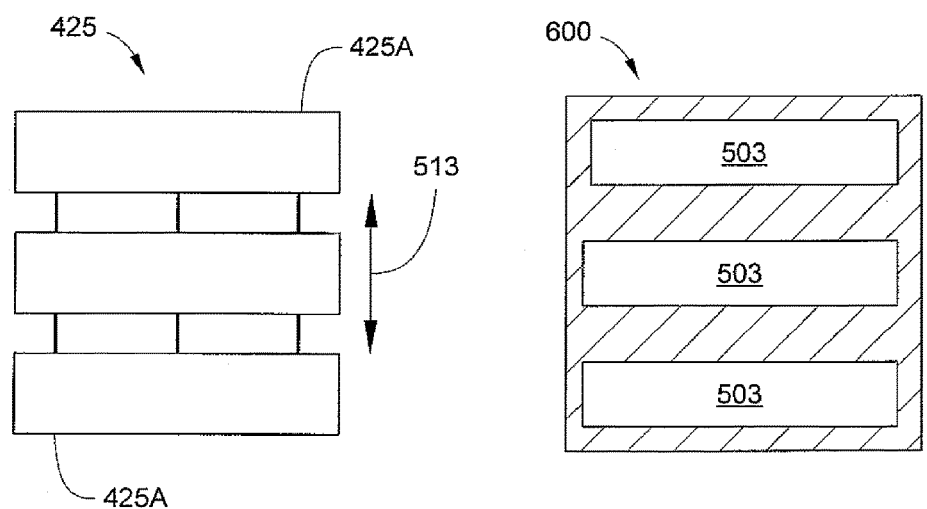
FIG. 6 is a schematic diagram illustrating one configuration of a MEMS shutter of the MEMS modulator of FIG. 4 and a corresponding array of apertures, arranged in accordance with at least some embodiments of the present disclosure.

FIG. 6 is a schematic diagram illustrating one configuration of MEMS shutter element 425 of MEMS modulator 303 and a corresponding array 600 of apertures 503, arranged in accordance with at least some embodiments of the present disclosure. For clarity, first MEMS comb drive 421 and second MEMS comb drive 422 are omitted from FIG. 6, but in practice are coupled to MEMS shutter element 425. As shown, array 600 may include a plurality of apertures 503, and MEMS shutter element 425 may include a plurality of portions 425A that may each be configured to obscure a respective one of the plurality of apertures 503. For reference, displacement 513 is indicated in FIG. 6. For purposes of illustration, MEMS shutter element 425 and array 600 are depicted side-by-side, while in practice portions 425A of MEMS shutter element 425 are substantially aligned with (e.g., on top of in this view) the plurality of apertures 503.

Figure 7:
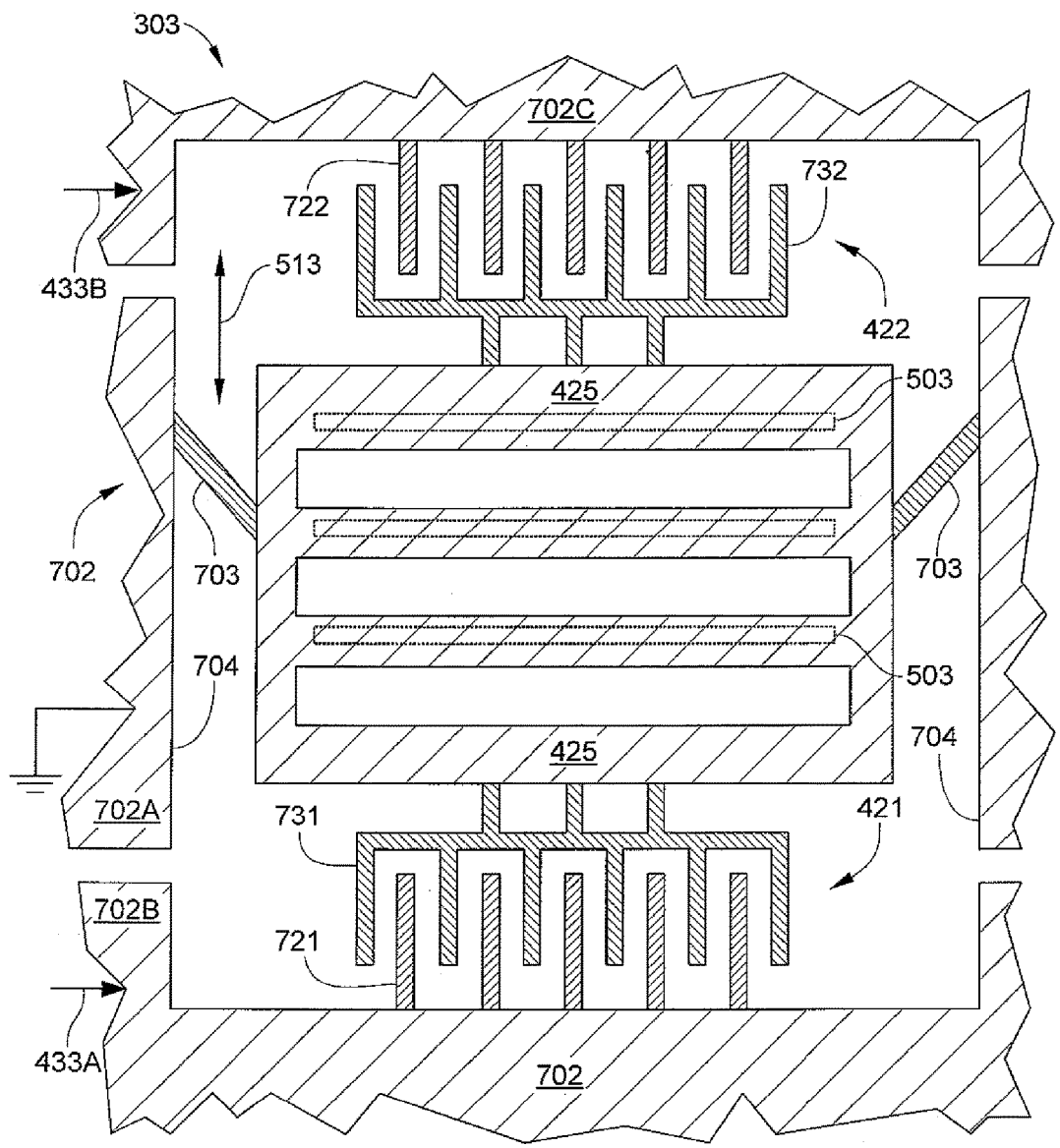
FIG. 7 is a schematic diagram of one configuration of the MEMS modulator of FIG. 4, according to at least some embodiments of the present disclosure.

FIG. 7 is a schematic diagram of one configuration of MEMS modulator 303, according to at least some embodiments of the present disclosure. MEMS modulator 303 may include first MEMS comb drive 421, second MEMS comb drive 422, MEMS shutter element 425, a frame 702, and in some embodiments, at least one spring 703, all arranged as shown. These components may be micro-machined from a layer of a MEMS substrate using various lithographic patterning and etching techniques, depending on the specific material layers formed on the substrate. MEMS shutter element 425 may be coupled to first MEMS comb drive 421 on a first side and coupled to second MEMS comb drive 422 on a second side that is substantially opposite the first side.

In some embodiments, MEMS shutter element 425 may be flexibly coupled to frame 702 by at least one spring 703 and/or by multiple springs 703. Springs 703 may be configured to maintain the positions of first MEMS comb drive 421 and second MEMS comb drive 422 with respect to sidewalls 704 and/or to prevent contact with blind element 540 (shown in FIG. 5). Unlike the flexible couplings employed in conventional MEMS comb drives, springs 703 may be configured to exert a small to insignificant return force on MEMS shutter element 425 when M EMS shutter element 425 is displaced from a neutral position. Thus, springs 703 may be configured to have no significant effect on the acceleration, and therefore displacement, of MEMS shutter element 425 during operation of MEMS modulator 303. For example, in some embodiments, springs 703 may be configured to exert a spring force on MEMS shutter element 425 that is no greater than about 10% of the force exerted on MEMS shutter element 425 by first MEMS comb drive 421 and/or by second MEMS comb drive 422 during operation of MEMS modulator 303. In this way, MEMS modulator 303 can be actuated at high speeds and at large displacements.

First MEMS comb drive 421 may include a static comb 721 and a movable comb 731 that are electrically isolated from each other. In such embodiments, movable comb 731 and MEMS shutter element 425 can be electrostatically actuated toward static comb 721 by the application of an electric field between static comb 721 and movable comb 731. To implement such electrostatic isolation, frame 702 may be separated into a grounded portion 702A and a charged portion 702B (or vice versa), where grounded portion 702A is electrically coupled to movable comb 731 and MEMS shutter element 425, while charged portion 702B is electrically coupled to static comb 721. For example, grounded portion 702A may be electrically coupled to movable comb 731 and MEMS shutter element 425 via springs 703. Charged portion 702B may be configured to receive, for example, positive voltage drive signal 433A from controller 301 and grounded portion 702A may be electrically coupled to electrical ground. Alternatively, grounded portion 702A may operate as a floating ground.

Similarly, second MEMS comb drive 422 may include a static comb 722 and a movable comb 732 that are electrically isolated from each other. In such embodiments, movable comb 732 and MEMS shutter element 425 can be electrostatically actuated toward static comb 722 by the application of an electric field between static comb 722 and movable comb 732. Grounded portion 702A may be electrically coupled to movable comb 722 and MEMS shutter element 425 via springs 703, and a charged portion 702C may be electrically coupled to static comb 732. In addition, charged portion 702A may be configured to receive, for example, negative voltage drive signal 433B from controller 301.

As shown in FIG. 7, MEMS shutter element 425 may be configured to at least partially obscure apertures 503 when in a closed state and reveal apertures 503 when in an open state. Thus, audio output signal 323 shown in FIG. 3 may be generated by the motion of MEMS shutter element 425 along displacement 513 when ultrasonic acoustic carrier signal 321 passes from acoustic pipe 505 and through apertures 503. As MEMS shutter element 425 moves along displacement 513 as caused by positive voltage drive signal 433A and negative voltage drive signal 433B, apertures 503 are alternately obscured and revealed by MEMS shutter 407. Thus, as shown in FIGS. 3 and 4, ultrasonic acoustic carrier signal 421 is modulated to generate audio output signal 423.

In some embodiments, one or both of first MEMS comb drive 421 and second MEMS comb drive 422 may be configured so that actuation force generated thereby is dependent on displacement of MEMS shutter element 425 in addition to voltage applied to the comb drive. In such embodiments, precise displacement control of MEMS shutter element 425 can be implemented in MEMS modulator 303 in comparison to embodiments previously described herein. In such embodiments, the improved displacement control of MEMS shutter element 425 may result because a displacement-dependent force generated by such a comb drive enables precise positioning of MEMS shutter element 425 by balancing the pulling force of one comb drive with the position-dependent force generated by the other comb drive.

Figure 8:
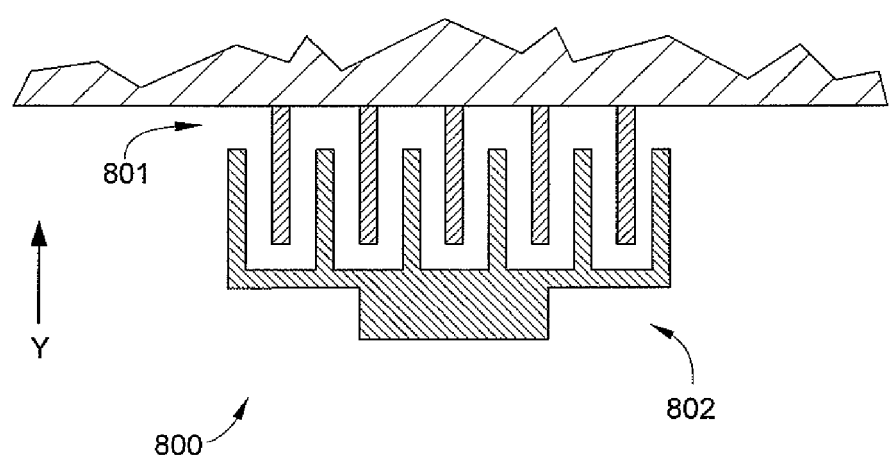
FIG. 8 is a schematic diagram illustrating a MEMS comb drive.

FIG. 8 is a schematic diagram illustrating a MEMS comb drive 800. In FIG. 8, the Y-axis is aligned with the primary motion direction of comb drive 800. Comb drive 800 may include a static comb 801 and a movable comb 802, and application of an electric field between static comb 801 and movable comb 802 causes movable comb 802 to move toward static comb 801. In such a comb drive, in which the fingers of static comb 801 and movable comb 802 overlap somewhat, the force $F_y$ generated in primary motion direction Y may be substantially independent of static comb 801 and movable comb 802. Such position independence of force $F_y$ may be indicated by Equations 1 and 2, where C=capacitance between a finger of static comb 801 and movable comb 802, $\square$=electric field strength, w=finger thickness, $y_i$=finger overlap, L=finger length, and g=finger separation.

$$C = \frac{\epsilon \cdot \text{Area}}{\text{gap}} = n\left(\frac{2\epsilon w}{L-y_1} + \frac{\epsilon t y_1}{g-x} + \frac{\epsilon t y_1}{g-x}\right) \quad (1)$$

$$F_{cy} + \frac{\partial}{\partial y}\frac{1}{2}CV^2 = \frac{1}{2}n \cdot \epsilon t[(g-x)^{-1} + (g+x)^{-1}]V^2 \quad (2)$$

Figure 9:
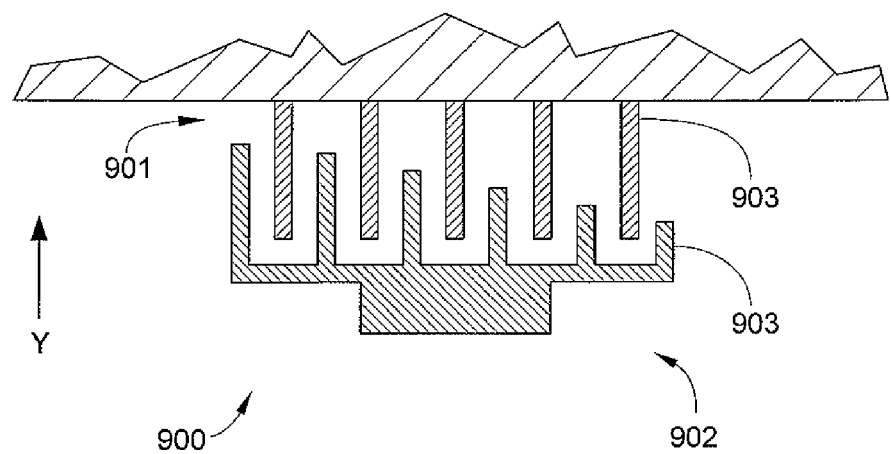
FIG. 9 is a schematic diagram illustrating a MEMS comb drive having comb drive fingers of varying lengths, according to an embodiment of the present disclosure.

As indicated by Equation 2, finger overlap $y_i$ is not a component of force $F_y$, since the field strength is given by the geometry of static comb 801 and movable comb 802. Thus, in a MEMS comb drive such as that shown in FIG. 8, force $F_y$ is substantially independent of displacement in the primary motion direction Y. However, according to embodiments of the disclosure, by employing comb fingers with prescribed shapes, a comb drive can be configured to generate a force on a shutter element in the primary motion direction Y that varies as a function of a separation distance along the primary motion direction between the movable comb of the comb drive and the static comb of the comb drive. Thus, a dependence of the electrostatic force on the Y-direction displacement of the movable comb can be designed into the comb drive. FIG. 9 schematically illustrates one such embodiment.

FIG. 9 is a schematic diagram illustrating a MEMS comb drive 900 having comb drive fingers of varying lengths, according to an embodiment of the present disclosure. Comb drive 900 may include a static comb 901 and a movable comb 902, where the fingers 903 of either static comb 901 or of movable comb 902 have varying lengths. In the embodiment illustrated in FIG. 9, fingers 903 of movable comb 902 vary in length and fingers 903 of static comb 901 may be equal in length. Force generated by comb drive 900 in the Y-direction may vary depending on how many of fingers 903 of static comb 901 and movable comb 902 overlap. Consequently, the force generated by comb drive 900 in the Y-direction may also be partially dependent on the displacement of movable comb 902 in the Y-direction. Stated another way, comb drive 900 may be configured to generate a force in the Y-direction that varies as a function of a separation distance along the Y-direction between static comb 901 and movable comb 902. In some embodiments, the function of the separation distance may comprise a non-linear function with respect to the separation distance.

Figure 10:
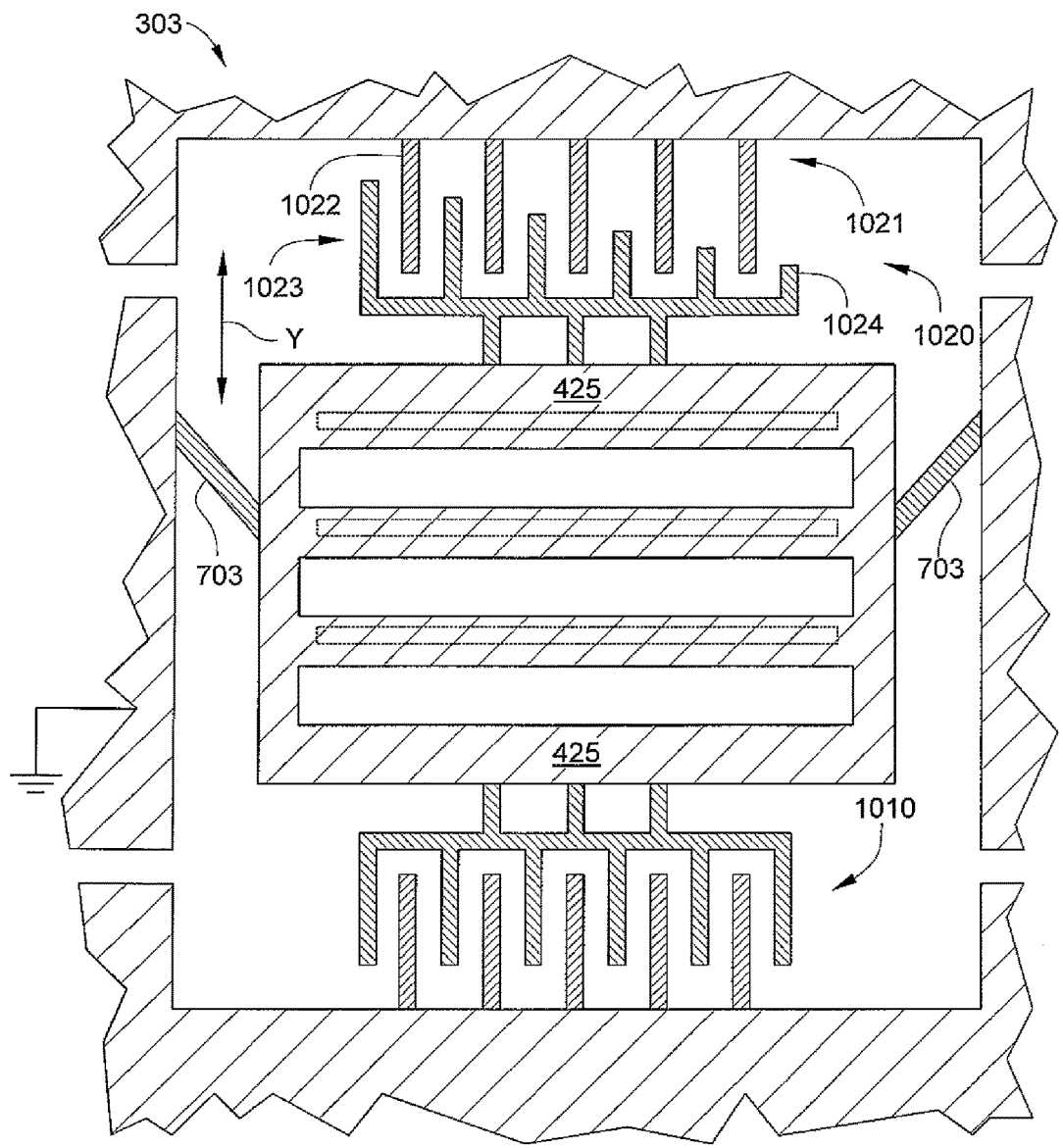
FIG. 10 is a schematic diagram of one configuration of the MEMS modulator of FIG. 4, according to at least some embodiments of the present disclosure.

FIG. 10 is a schematic diagram of one configuration of MEMS modulator 303, according to at least some embodiments of the present disclosure. MEMS modulator 303 may include a first MEMS comb drive 1010, a second MEMS comb drive 1020, MEMS shutter element 425, frame 702, and in some embodiments, at least one spring 703, all arranged as shown. Second MEMS comb drive 1020 includes a static comb 1021 with fingers 1022 having substantially equal length and a movable comb 1023 having fingers 1024 that vary in length. Thus, a force generated by second MEMS comb drive 1020 in the primary motion direction of MEMS comb drive 1020 is partially dependent on the displacement of movable comb 1023 in the primary motion direction. In some embodiments, each of fingers 1024 has a different length relative to each other, and in other embodiments some but not all of fingers 1024 may be equal in length relative to each other. In the embodiment illustrated in FIG. 10, the lengths of fingers 1024 get progressively shorter from the left end to the right end of movable comb 1023. In other embodiments, the lengths of fingers 1024 may be substantially uniform, while it is the lengths of fingers 1022 that vary. Other arrangement of length variation for either or both movable comb 1023 and static comb 1021 may be provided.

In operation, first MEMS comb drive 1010 and second MEMS comb drive 1020 are activated to move MEMS shutter frame 425 in a direction parallel to the primary motion direction of first MEMS comb drive 1010 and second MEMS comb drive 1020 (e.g., upward or downward). To generate maximal or increased force with minimal or reduced voltage, the initial movement of MEMS shutter element 425 may be implemented using one of first MEMS comb drive 1010 or second MEMS comb drive 1020 (e.g., first MEMS comb drive 1010), while the other is shorted and/or not energized. To stabilize the position of MEMS shutter element 425 at a particular location in the Y-direction, the second drive (e.g., second MEMS comb drive 1020) is switched on. The applied voltages may be selected so that MEMS shutter element 425 comes to equilibrium at the particular location.

In one embodiment, the capacitance of first MEMS comb drive 1010 or second MEMS comb drive 1020 can be measured (or otherwise determined) and used to monitor the displacement of MEMS shutter element 425 as one comb drive (e.g., first MEMS comb drive 1010) moves MEMS shutter element 425. Then, when MEMS shutter element 425 is measured to be near a target displacement or speed, the opposing drive (e.g., second MEMS comb drive 1020) may be switched on to counterbalance the first comb drive. The voltages are applied to fix the Y-direction displacement of MEMS shutter element 425 in a new equilibrium position that corresponds to the target displacement. It is noted that the force acting on MEMS shutter element 425 is much larger due to the absence of the spring restoring force that in a conventional MEMS comb drive would be countering this force. Consequently, the configuration of MEMS modulator 303 illustrated in FIG. 10 may operate with lower operating voltages, faster switching times, or a combination of both.

Figure 11:
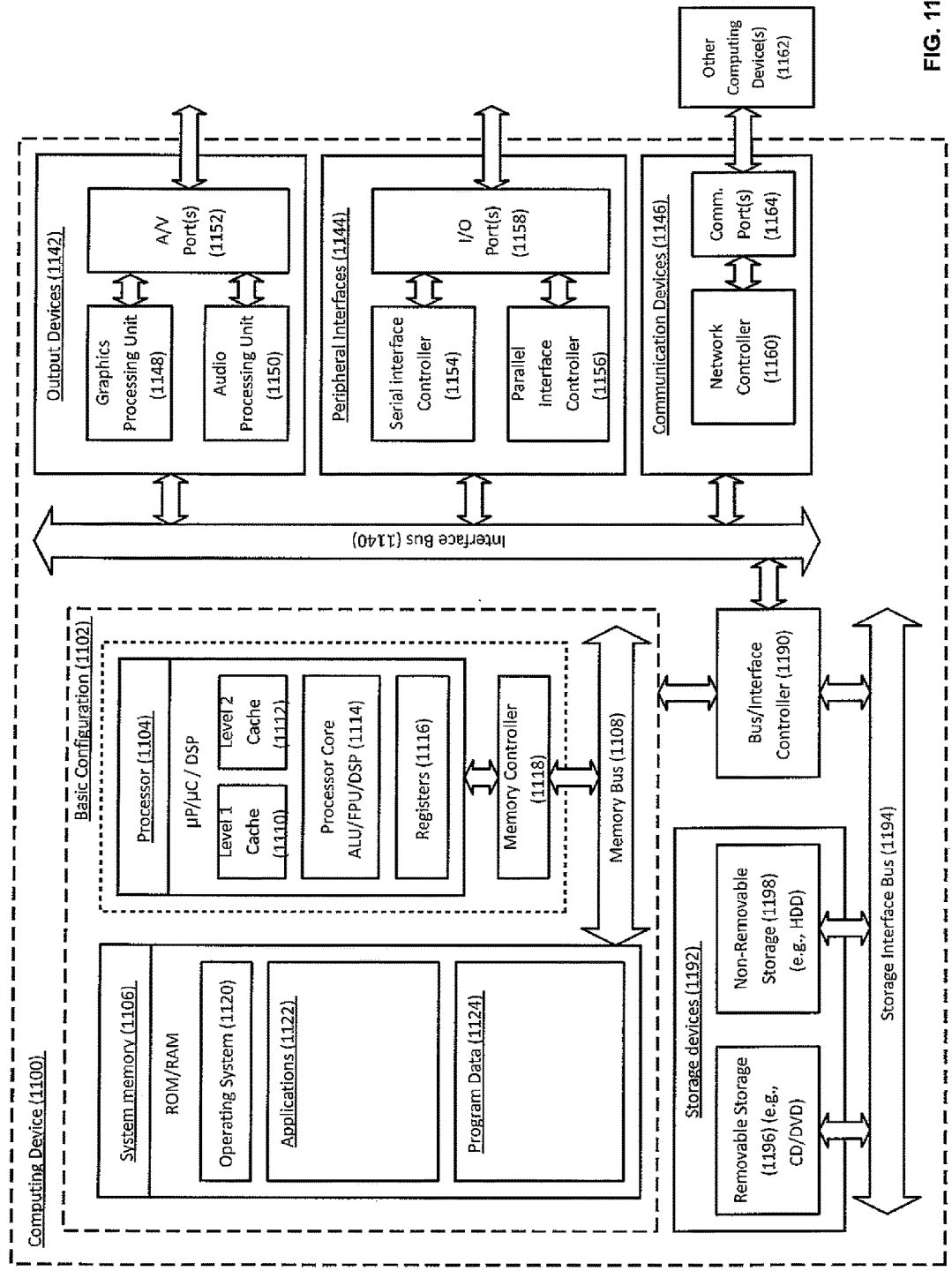
FIG. 11 is a block diagram illustrating an example computing device in which one or more embodiments of the present disclosure may be implemented.

FIG. 11 is a block diagram illustrating an example computing device in which one or more embodiments of the present disclosure may be implemented, and more specifically, FIG. 11 is a block diagram illustrating an example computing device 1100 that may be used in conjunction with a pico speaker system as described herein, in accordance with at least some embodiments of the present disclosure. In a very basic configuration 1102, computing device 1100 typically includes one or more processors 1104 and a system memory 1106. A memory bus 1108 may be used for communicating between processor 1104 and system memory 1106.

Depending on the desired configuration, processor 1104 may be of any type including but not limited to a microprocessor (µP), a microcontroller (µC), a digital signal processor (DSP), or any combination thereof. Processor 1104 may include one more levels of caching, such as a level one cache 1110 and a level two cache 1112, a processor core 1114, and registers 1116. An example processor core 1114 may include an arithmetic logic unit (ALU), a floating point unit (FPU), a digital signal processing core (DSP Core), or any combination thereof. Processor 1104 may include programmable logic circuits, such as, without limitation, field-programmable gate arrays (FPGAs), patchable application-specific integrated circuits (ASICs), complex programmable logic devices (CPLDs), and others. An example memory controller 1118 may also be used with processor 1104, or in some implementations memory controller 1118 may be an internal part of processor 1104. In some embodiments, controller 301 described above with respect to FIG. 3 can be implemented by processor 1104.

Depending on the desired configuration, system memory 1106 may be of any type including but not limited to volatile memory (such as RAM), non-volatile memory (such as ROM, flash memory, etc.) or any combination thereof. System memory 1106 may include an operating system 1120, one or more applications 1122, and program data 1124. Program data 1124 may include data that may be useful for operation of computing device 1100. In some embodiments, application 1122 may be arranged to operate with program data 1124 on operating system 1120. In some embodiments, application 1122 and/or operating system 1120 may be executed by or work concurrently with processor 1104 to provide voltage drive signal 433, oscillation signal 333, oscillation signal 331, and/or other signal(s) or combination(s) thereof. This described basic configuration 1102 is illustrated in FIG. 11 by those components within the inner dashed line.

Computing device 1100 may have additional features or functionality, and additional interfaces to facilitate communications between basic configuration 1102 and any required devices and interfaces. For example, a bus/interface controller 1190 may be used to facilitate communications between basic configuration 1102 and one or more data storage devices 1192 via a storage interface bus 1194. Data storage devices 1192 may be removable storage devices 1196, non-removable storage devices 1198, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 1106, removable storage devices 1196 and non-removable storage devices 1198 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 1100. Any such computer storage media may be part of computing device 1100.

Computing device 1100 may also include an interface bus 1140 for facilitating communication from various interface devices (e.g., output devices 1142, peripheral interfaces 1144, and communication devices 1146) to basic configuration 1102 via bus/interface controller 1190. Example output devices 1142 include a graphics processing unit 1148 and an audio processing unit 1150, which may be configured to communicate to various external devices such as a display or speakers via one or more A/V ports 1152. Such speakers may include one or more embodiments of pico speaker systems as described herein. Example peripheral interfaces 1144 include a serial interface controller 1154 or a parallel interface controller 1156, which may be configured to communicate with external devices such as input devices (e.g., keyboard, mouse, pen, voice input device, touch input device, etc.) or other peripheral devices (e.g., printer, scanner, etc.) via one or more I/O ports 1158. An example communication device 1146 includes a network controller 1160, which may be arranged to facilitate communications with one or more other computing devices 1162 over a network communication link, such as, without limitation, optical fiber, Long Term Evolution (LTE), 3G, WiMax, via one or more communication ports 1164.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 1100 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1100 may also be implemented as a personal computer including both laptop computer and non-laptop computer configurations.

As described herein, embodiments of the present disclosure include a MEMS-based audio speaker system that includes a MEMS dual comb drive for modulation of an ultrasonic acoustic signal. Such a modulator is configured without a high-force return spring, and therefore can be actuated at both high speed and for large displacements. In addition, a feedback mechanism greatly reduces sensitivity to long-term drift and short-term positioning inaccuracies caused by sudden accelerations or drops.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). Atypical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments are possible The various aspects and embodiments disclosed herein are for purposes of illustration and are not intended to be limiting, with the true scope and spirit being indicated by the following claims.

I claim:

1. A speaker device, comprising:
    a planar oscillation element configured to generate an ultrasonic acoustic signal;
    a shutter element configured to cover an opening that is positioned to receive the ultrasonic acoustic signal to modulate the ultrasonic acoustic signal such that an audio signal is generated;
    an electrostatically actuated first comb drive coupled to the shutter element and configured to displace the shutter element in a first direction in response to a first electrical bias applied between a static comb of the first comb drive and a movable comb of the first comb drive;
    an electrostatically actuated second comb drive coupled to the shutter element and configured to displace the shutter element in a second direction that is opposite to the first direction in response to a second electrical bias applied between a static comb of the second comb drive and a movable comb of the second comb drive; and
    a spring element coupled to the shutter element, wherein the spring element is configured to generate a spring force on the shutter element in response to the shutter element being displaced a distance in the first direction by the first comb drive, and wherein the spring force is less than a comb drive force generated by the first comb drive to displace the shutter element the distance.

2. The speaker device of claim 1, wherein the first comb drive is configured to displace the shutter element in the first direction by a linear translation of the shutter element.

3. The speaker device of claim 1, wherein first comb drive is disposed on a first side of the shutter element and the second comb drive is disposed on a second side of the shutter element, and wherein the second side is an opposite side of the shutter element from the first side.

4. The speaker device of claim 1, wherein the spring force is parallel to the first direction.

5. The speaker device of claim 1, wherein the spring force is no greater than about one tenth the comb drive force.

6. The speaker device of claim 1, wherein the shutter element is positioned substantially parallel to a surface of the planar oscillating element.

7. The speaker device of claim 1, wherein the first comb drive is configured to generate a force on the shutter element in the first direction that varies as a function of a separation distance along the first direction between the movable comb of the first comb drive and the static comb of the first comb drive.

8. The speaker device of claim 7, wherein the first comb drive is configured to generate the force on the shutter element in response to the first electrical bias applied between the static comb of the first comb drive and the movable comb of the first comb drive.

9. The speaker device of claim 8, wherein the function of the separation distance comprises a non-linear function with respect to the separation distance.

10. The speaker device of claim 1, wherein two or more fingers of the movable comb of the first comb drive or of the movable comb of the second comb drive, have significantly different lengths relative to each other.

11. The speaker device of claim g claim 1, wherein two or more fingers of the static comb of the first comb drive or of the static comb of the second comb drive, have significantly different lengths relative to each other.

12. The speaker device of claim 1, further comprising a controller that includes a second order differentiator configured to determine an acceleration of the shutter element in the first direction to cover the opening, wherein the acceleration is based on a target audio signal.

13. The speaker device of claim 12, wherein the second order differentiator is further configured to determine an acceleration of the shutter element in the second direction to uncover the opening, wherein the acceleration is based on the target audio signal.

14. The speaker device of claim 1, further comprising a displacement detection device configured to compare an actual displacement of the shutter element with a target displacement of the shutter element.

15. The speaker device of claim 14, wherein the displacement detection device comprises a capacitance measurement element.

16. An microelectromechanical systems (MEMS) actuator, comprising:
    a body element;
    an electrostatically actuated first comb drive coupled to the body element and configured to displace the body element in a first direction in response to a first electrical bias applied between a static comb of the first comb drive and a movable comb of the first comb drive;
    an electrostatically actuated second comb drive coupled to the body element and configured to displace the body element in a second direction that is opposite to the first direction in response to a second electrical bias applied between a static comb of the second comb drive and a movable comb of the second comb drive; and
    a spring element coupled to the body element, wherein the spring element is configured to generate a spring force on the body element in response to the body element being displaced a distance in the first direction by the first comb drive, and wherein the spring force is less than a comb drive force generated by the first comb drive to displace the body element the distance.

17. The microelectromechanical systems actuator of claim 16, wherein the spring force is parallel to the first direction.

18. The microelectromechanical systems actuator of claim 16, wherein the spring force is no greater than about one tenth the comb drive force.

19. The microelectromechanical systems actuator of claim 16, wherein the first comb drive is configured to generate a force on the body element in the first direction that varies as a function of a separation distance along the first direction between the movable comb of the first comb drive and the static comb of the first comb drive.

20. The microelectromechanical systems actuator of claim 19, wherein two or more fingers of the movable comb of the first comb drive or of the movable comb of the second comb drive have significantly different lengths relative to each other.

21. The microelectromechanical systems actuator of claim 16, wherein the first and second directions are substantially parallel to a direction of an acoustic signal modulated by the body element.

22. The microelectromechanical systems actuator of claim 16, wherein the first and second directions are substantially orthogonal to a direction of an acoustic signal modulated by the body element.

23. A method to operate a microelectromechanical system (MEMS) speaker device, the method comprising:
    generating an ultrasonic acoustic signal with a planar oscillation element; and
    modulating the ultrasonic acoustic signal to generate an audio signal by operating a shutter element to cover an opening that is positioned to receive the ultrasonic acoustic signal,
    wherein operating the shutter element includes:
        electrostatically actuating a first comb drive to displace the shutter element in a first direction in response to a first electrical bias applied between a static comb of the first comb drive and a movable comb of the first comb drive; and
        electrostatically actuating a second comb drive to displace the shutter element in a second direction that is opposite to the first direction in response to a second electrical bias applied between a static comb of the second comb drive and a movable comb of the second comb drive, and
    wherein at least one of:
        two or more fingers of the movable comb of the first comb drive have different lengths relative to each other,
        two or more fingers of the movable comb of the second comb drive have different lengths relative to each other,
        two or more fingers of the static comb of the first comb drive have different lengths relative to each other, and
        two or more fingers of the static comb of the second comb drive have different lengths relative to each other.

24. The method of claim 23, wherein:
    the MEMS speaker device includes a spring element coupled to the shutter element,
    the spring element is configured to generate a spring force on the shutter element in response to the shutter element being displaced a distance in the first direction by the first comb drive
    the spring force is less than a comb drive force generated by the first comb drive to displace the shutter element the distance, and
    electrostatically actuating the first comb drive to displace the shutter element in the first direction comprises generating an electrostatic force that is at least about 10 times greater than the spring force which resists displacement of the shutter element in the first direction.

25. The method of claim 23, wherein the first comb drive is configured to generate a force on the body element in the first direction that varies as a function of a separation distance along the first direction between the movable comb of the first comb drive and the static comb of the first comb drive.

* * * * *